United States Patent [19]
Kuo

[11] Patent Number: 6,052,013
[45] Date of Patent: Apr. 18, 2000

[54] APPARATUS FOR GENERATING A TIMING SIGNAL

[75] Inventor: Jack-Lian Kuo, Tainan, Taiwan

[73] Assignee: Vanguard International Semiconductor Corporation, Hsinchu, Taiwan

[21] Appl. No.: 09/063,997

[22] Filed: Apr. 21, 1998

[51] Int. Cl.$^7$ ........................................ H03L 5/00
[52] U.S. Cl. ........................... 327/333; 331/57; 327/166; 327/176; 327/299
[58] Field of Search ..................................... 327/166, 176, 327/299, 333; 326/63, 80; 331/57

[56] References Cited

U.S. PATENT DOCUMENTS

| | | | |
|---|---|---|---|
| 5,424,690 | 6/1995 | Ohno | 331/57 |
| 5,493,245 | 2/1996 | Kao et al. | 327/333 |
| 5,912,577 | 6/1999 | Takagi | 327/333 |

*Primary Examiner*—Timothy P. Callahan
*Assistant Examiner*—Cassandra Cox
*Attorney, Agent, or Firm*—Christensen O'Connor Johnson & Kindness PLLC

[57] ABSTRACT

An apparatus having an input node and an output node for generating a timing signal. The apparatus includes an enabling circuit, one or more inverters, and one or more capacitive elements. The enabling circuit generates a signal of a first state when one or both of the input node and the output node are of a second state, and generates a signal of the second state when both of the input node and the output node are of the first state. The first state and the second state represent two opposite logic states. The inverters generate opposite state outputs in responsive with their inputs. The inverters are connected in series with a first inverter being responsive to the enabling circuit and a last inverter for generating a signal for the output node. The capacitive elements are connected between a voltage source and one of the inputs of the inverters.

18 Claims, 1 Drawing Sheet

APPARATUS FOR GENERATING A TIMING SIGNAL

TECHNICAL FIELD OF THE INVENTION

The present invention relates to a signal generator, and more specifically, to an apparatus for generating a timing signal with low power consumption.

BACKGROUND OF THE INVENTION

Timing signal generation is of vital application in digital circuits. Devices in the circuits are operated according to the timing signal to ensure the correct timing of signal transfer and other interactions. A timing generator capable of generating a stable and accurate periodic pulse signal provides a reliable reference for the operation of the circuits.

The timing generator of early years is realized by employing a clocking source, such as a crystal oscillator or quartz oscillator. The crystal oscillator provides high frequency and stable clock wave or periodic pulses with accurate timing. However, the clocking pulses are generated by the resonance effect with a fixed frequency. Thus, the frequency of the timing signal is limited by the fixed frequency and only frequencies that are multiples of the fixed frequency. With the various designs and operation modes of the circuits, the application is quite limited when the designed operating frequency of the circuit is not matched.

Many circuits have been proposed for providing selectable and adjustable frequencies of the timing signal. Devices like capacitors, flip-flop' s, inverters, and comparators are widely applied and combined to form timing signal generators. A timing generator has to operate continuously once the power is supplied to set the circuit into operation. The timing generator is operated with a predesigned voltage such as 5 volts, 3.3 volts, or 2.5 volts. The operational power consumption of the timing generator under these voltages can be great. The significant power consumption and heat generation under continuous operation becomes an issue with the downsizing of circuit design.

A low power timing generator is preferred for portable devices with a limited battery capacity. The power consumption problem of a conventional timing generator must be solved for providing more efficient operation of the circuits. Further, the heat generation must be reduced at the same time to increase the reliability and life of the circuits.

SUMMARY OF THE INVENTION

An apparatus having an input node and an output node for generating a timing signal is disclosed. The apparatus comprises: a NAND gate responsive to said input node and said output node for generating a signal of a first state when both of said input node and said output node are of a second state, and generating a signal of said second state when both of said input node and said output node are of said first state, said first state and said second state representing two opposite logic states; at least one inverter being connected in series with a first inverter being responsive to said NAND gate and a last inverter for generating a signal for said output node; at least one capacitive element being connected between a voltage source and one of said inputs of said at least one inverter; and a voltage amplifier for shifting said first state at said output node to a third state with a greater voltage, and shifting said second state at said output node to a fourth state with an equal voltage.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention discloses a low power apparatus for generating a timing signal. The timing signal generator can operate at a lower voltage with reduced device area. The size of the capacitors and transistors can be narrowed and power consumption and heat generation problems are reduced.

Figure 1:
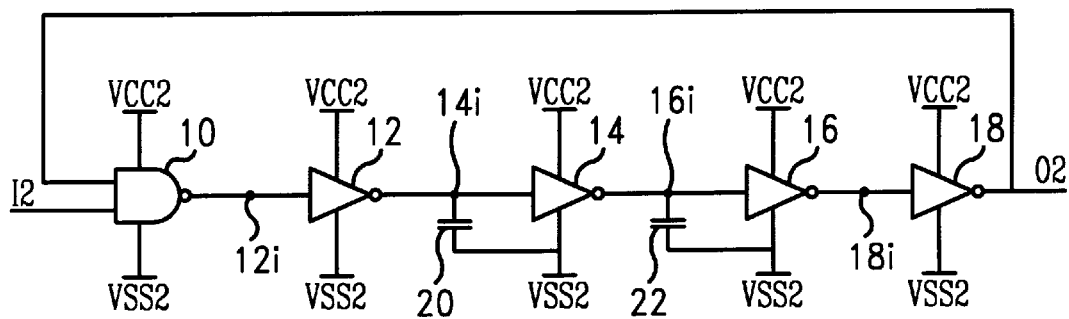
FIG. 1 illustrates an apparatus for generating a timing signal in accordance with the present invention.

Turning to FIG. 1, an apparatus for generating a timing signal in accordance with the present invention is illustrated. The apparatus has an input node I2 and an output node O2. The timing signal is generated at the output node O2. The apparatus has an enabling circuit 10, one or more inverters 12, 14, 16, and 18, and one or more capacitive elements 20 and 22.

The enabling circuit 10 is used to generate a signal of a first state when one or both the input node I2 and the output node O2 are of a second state, and to generate a signal of the second state when both the input node I2 and the output node O2 are of the first state. The first state and the second state are used to represent two opposite logic states of the logic circuit. In this case, the first state is a high voltage level state and the second state is a low voltage level state. With the reduced operational voltage in the present invention, the first state is between about 0.8 volts to about 2 volts and the second state is about 0 volts. Typically, the enabling circuit 10 is a NAND gate being responsive to the input node I2 and the output node O2 for providing aforementioned operation.

The inverters 12, 14, 16, and 18 are employed for generating outputs with opposite states to the inputs. In the embodiment, the application of four inverters are illustrated. The number of the inverters can be modified to provide less or more delaying stages. Two inverters, six inverters, or even more inverters can be used. Inverters used with odd numbers can provide similar operation and the meaning of an enable signal at the node I2 is reversed.

In this case, the four inverters are connected in series with a first inverter 12 being responsive to the enabling circuit 10 and a last inverter 18 for generating a signal for the output node O2. The output of the first inverter is coupled with the input of the second inverter 14 and the output of the second inverter 14 is coupled with the input of the third inverter 16. Then the output of the third inverter 16 is coupled with the input of the last inverter 18 to form a series construction, as illustrated in FIG. 1.

Figure 2:
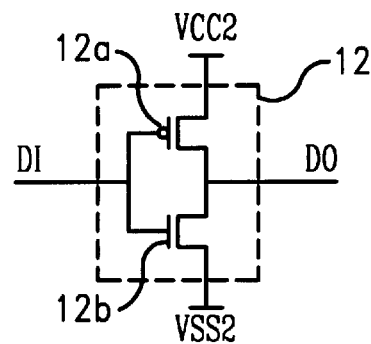
FIG. 2 illustrates an inverter formed by CMOS construction in accordance with the present invention.

In general, the inverters 12, 14, 16, and 18 are CMOS inverters. Referring to FIG. 2, a typical CMOS inverter 12 including a PMOS 12a and a NMOS 12b is illustrated. The PMOS 12a is connected between an output DO and a voltage source VCC2 with its junction. The NMOS 12b is connected between a voltage source VSS0 and the output DO and with its junction. The gates of the PMOS 12a and of the NMOS 12b are responsive with an input DI to generate the output DO at an opposite logic state.

Turning to FIG. 1, the enabling circuit 10 and the inverters 12, 14, 16, and 18 are operated with a set of power supplies having a high state VCC2 and a low state VSS2. As an example, the high state VCC2 can be the first state with a voltage level between about 0.8 volts to about 2 volts and the low state can be the second state with a voltage level of about 0 volts.

The capacitive elements 20 and 22 are connected between the voltage source VSS2 and one of the inputs of the inverters 12, 14, 16, and 18. In the preferred embodiment, two capacitive elements 20 and 22 are used respectively with the second inverter 14 and the third inverter 16. The first capacitive element 20 is connected with the second inverter input and the second capacitive element 22 is connected with the third inverter input. The capacitive elements 20 and 22 can be formed from MOS transistors to make the fabrication process fully compatible with the CMOS process. The two junctions of MOS transistors can be connected together and a capacitive element is formed between a gate and the junction.

Turning to FIG. 1, when a second state of 0 volts is presented at the input node I2, the state at node 12$i$ is high (or the first state), as well as the node 16$i$ and the output node O2. The state at node 12$i$ is maintained at high state and the circuit is stopped from operation. When the input node I2 is high, the circuit is enabled. At first, the node 12$i$ drops to low due to the fact that the output node O2 is high. The voltage at node 14$i$ then increases to charge the capacitive element 20. The charging time is determined by the capacitance of the capacitive element 20. When the voltage at node 14$i$ reaches high, the voltage at node 16$i$ drops and the capacitive element 22 is discharged. The charging time is also determined by the capacitance of the capacitive element 22. When the voltage at node 16$i$ reaches low, the voltage at the output node O2 drops to low.

Next, the node 12$i$ becomes high due to that the output node O2 is low. The voltage at node 14$i$ decreases to discharge the capacitive element 20. Then the voltage at node 16$i$ increases and the capacitive element 22 is charged. When the voltage at node 16$i$ reaches high, the voltage at the output node O2 returns to high.

Thus, an oscillating timing signal can be generated at the output node O2 with the continuous operation of the circuit. By varying the capacitance of the capacitive elements 20 and 22, the frequency of the timing signal can be adjusted.

The capacitance of the capacitive elements 20 and 22 can be varied within a wide range. For the application in the embodiment, capacitance of the two elements can be ranged from about 5 pF to about 30 pF. More specifically, with the two opposite logic states at 1.5 volts and 0 volts, the capacitance of the capacitive elements 20 and 22 are set at 10 pF to have a timing period of 1.5 nanoseconds. With the reduced operational voltage and the minimized power in charging and discharging small capacitive elements, a reduced power consumption as low as about 0.375 miliwatts can be achieved. The power consumption is far less than conventional timing generators which consumes as much as several miliwatts.

Figure 3:
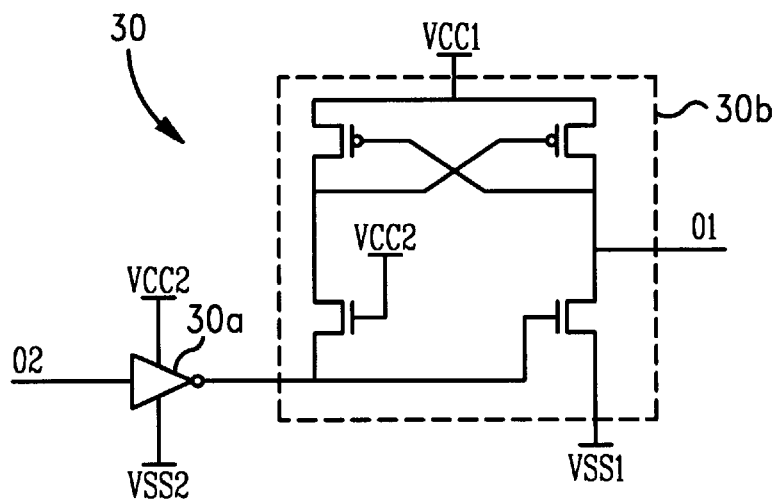
FIG. 3 illustrates a shifting circuit for shifting between voltage states in accordance with the present invention.

For incorporating the present invention with the circuits operating at higher voltage, a voltage shifting circuit 30 as shown in FIG. 3 can be employed. Thus, a timing signal with the same frequency and raised voltage is provided. The voltage shifting circuit 30 is responsive to the output node O2 to shift the first state at the output node to a third state, and to shift the second state at the output node to a fourth state. Typically, the third state is between about 2 volts to about 5 volts and the fourth state is about 0 volts. A well known voltage amplifier can be used as the shifting circuit 30. A construction of voltage amplifier with an inverter 30$a$ and a level-shifting amplifier 30$b$ is illustrated in FIG. 3.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. An apparatus having an input node and an output node for generating a timing signal, said apparatus comprising:

an enabling circuit configured to generate a signal of a first state when one or both of said input node and said output node are of a second state and to generate a signal of said second state when both of said input node and said output node are of said first state, said first state and said second state representing two opposite logic states;

at least one inverter being connected in series with a first inverter being responsive to said enabling circuit and a last inverter for generating a signal for said output node; and at least one capacitive element being connected between a voltage source and one of said inputs of said at least one inverter, said voltage source being configured to provide said second state.

2. The apparatus of claim 1 further comprising means for shifting said first state at said output node to a third state, and shifting said second state at said output node to a fourth state.

3. The apparatus of claim 2, wherein said shifting means is a voltage amplifier.

4. The apparatus of claim 2, wherein said first state is between about 0.8 volt to 2 volts, said third state is between about 2 volts to about 5 volts, and said second state and said fourth state are about 0 volts.

5. The apparatus of claim 1, wherein said enabling circuit comprises a NAND gate being responsive to said input node and said output node.

6. An apparatus having an input node and an output node for generating a timing signal, said apparatus comprising:

an enabling circuit for generating a signal of a first state when one or both of said input node and said output node are of a second state, and generating a signal of said second state when both of said input node and said output node are of said first state, said first state and said second state representing two opposite logic states;

at least one inverter being connected in series with a first inverter being responsive to said enabling circuit and a last inverter for generating a signal for said output node, wherein said first state is between about 0.8 volts to 2 volts and said second state is about 0 volts; and at least one capacitive element being connected between a voltage source and one of said inputs of said at least one inverter, said voltage source being configured to provide said second state.

7. The apparatus of claim 1, wherein said at least one inverter comprises a CMOS inverter.

8. The apparatus of claim 1, wherein the total number of said inverters is four.

9. The apparatus of claim 8, wherein the number of said capacitive elements is two, a first capacitive element being connected with a second inverter input and a second capacitive element being connected with a third inverter input.

10. The apparatus of claim 9, wherein said first capacitive element has a capacitance between about 5 pF to about 30 pF and said second capacitive element has a capacitance between about 5 pF to about 30 pF.

11. The apparatus of claim 1, wherein said capacitive elements are capacitors formed by MOS transistors.

12. An apparatus having an input node and an output node for generating a timing signal, said apparatus comprising:

- a NAND gate responsive to said input node and said output node for generating a signal of a first state when both of said input node and said output node are of a second state, and generating a signal of said second state when both of said input node and said output node are of said first state, said first state and said second state representing two opposite logic states;
- at least one inverter being connected in series with a first inverter being responsive to said NAND gate and a last inverter for generating a signal for said output node;
- at least one capacitive element being connected between a voltage source and one of said inputs of said at least one inverter, said voltage source being configured to provide said second state; and
- a voltage amplifier for shifting said first state at said output node to a third state with a greater voltage, and shifting said second state at said output node to a fourth state with an equal voltage.

13. The apparatus of claim 12, wherein said first state is between about 0.8 volts to 2 volts, said third state is between about 2 volts to about 5 volts, and said second state and said fourth state are about 0 volts.

14. The apparatus of claim 12, wherein said at least one inverter comprise a CMOS inverters.

15. The apparatus of claim 12, wherein the total number of said inverters is four.

16. The apparatus of claim 15, wherein the number of said capacitive elements is two, a first capacitive element being connected with a second inverter input and a second capacitive element being connected with a third inverter input.

17. The apparatus of claim 16, wherein said first capacitive element has a capacitance between about 5 pF to about 30 pF and said second capacitive element has a capacitance between about 5 pF to about 30 pF.

18. The apparatus of claim 12, wherein said capacitive elements are capacitors formed by MOS transistors.

* * * * *